United States Patent
Liu et al.

(10) Patent No.: US 11,404,681 B2
(45) Date of Patent: Aug. 2, 2022

(54) DISPLAY PANEL, MANUFACTURING METHOD THEREOF, AND DISPLAY DEVICE

(71) Applicant: YUNGU (GU'AN) TECHNOLOGY CO., LTD., Hebei (CN)

(72) Inventors: Shengfang Liu, Kunshan (CN); Ying Huang, Kunshan (CN); Xueyuan Li, Kunshan (CN); Ping Zhu, Kunshan (CN); Lei Lv, Kunshan (CN); Yibo Zhang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 196 days.

(21) Appl. No.: 16/941,957

(22) Filed: Jul. 29, 2020

(65) Prior Publication Data
US 2020/0358041 A1    Nov. 12, 2020

Related U.S. Application Data

(63) Continuation of application No. PCT/CN2019/089088, filed on May 29, 2019.

(30) Foreign Application Priority Data

Nov. 27, 2018   (CN) .......................... 201811429243.1

(51) Int. Cl.
  *G09F 9/30*     (2006.01)
  *H01L 51/56*    (2006.01)
  (Continued)

(52) U.S. Cl.
  CPC ............ *H01L 51/56* (2013.01); *G06F 1/1652* (2013.01); *G09F 9/301* (2013.01); *H01L 51/5209* (2013.01); *H01L 51/5253* (2013.01)

(58) Field of Classification Search
  CPC ... G09F 9/301; G06F 1/1652; H01L 51/0021; H01L 51/56; H01L 51/5206; H01L 51/5209; H01L 51/5253; H01L 2251/5392
  See application file for complete search history.

(56) References Cited

U.S. PATENT DOCUMENTS 7,001,498 B2 *   2/2006   Colgan ............... H01L 27/1292
                                                        205/133
7,393,474 B2 *   7/2008   Park ...................... H01B 1/124
                                                        252/500
(Continued)

FOREIGN PATENT DOCUMENTS

CN    101037556 A    9/2007
CN    104576968 A    4/2015
(Continued)

OTHER PUBLICATIONS

Examination Report dated Jul. 25, 2019 of corresponding Chinese application No. 201811429243.1; 5 pages.
(Continued)

*Primary Examiner* — Joe H Cheng
(74) *Attorney, Agent, or Firm* — Maier & Maier, PLLC

(57) ABSTRACT

A display panel, a manufacturing method thereof, and a display device. The manufacturing method includes: providing a pretreatment solution containing a water-soluble organic protective agent, and forming, on an anode, a solution layer covering the anode; drying the solution layer to form an adhesive layer; removing the adhesive layer; and drying the anode; where the pretreatment solution contains 10-30% by weight of propylene glycol methyl ether and 70-90% by weight of water.

20 Claims, 1 Drawing Sheet

(51) Int. Cl.
*G06F 1/16* (2006.01)
*H01L 51/52* (2006.01)

(56) References Cited

U.S. PATENT DOCUMENTS

| | | |
|---|---|---|
| 7,582,339 B2 | 9/2009 | Kim et al. |
| 2003/0038037 A1 | 2/2003 | Colgan et al. |
| 2004/0137239 A1* | 7/2004 | Klos ................ C09D 5/44 |
| | | 428/626 |
| 2005/0029932 A1* | 2/2005 | Yang .............. H01L 51/5215 |
| | | 313/506 |
| 2006/0204678 A1 | 9/2006 | Hayashi et al. |
| 2007/0256709 A1 | 11/2007 | Shang et al. |

FOREIGN PATENT DOCUMENTS

| | | | | |
|---|---|---|---|---|
| CN | 104600221 A | | 5/2015 | |
| CN | 108806990 A | | 11/2018 | |
| CN | 109599506 A | | 4/2019 | |
| JP | 2008218777 A | * | 9/2008 | |
| WO | WO-2018101536 A2 | * | 6/2018 | ............. C09K 11/06 |

OTHER PUBLICATIONS

International Search Report dated Sep. 2, 2019 in corresponding International application No. PCT/CN2019/089088; 4 pages.

* cited by examiner

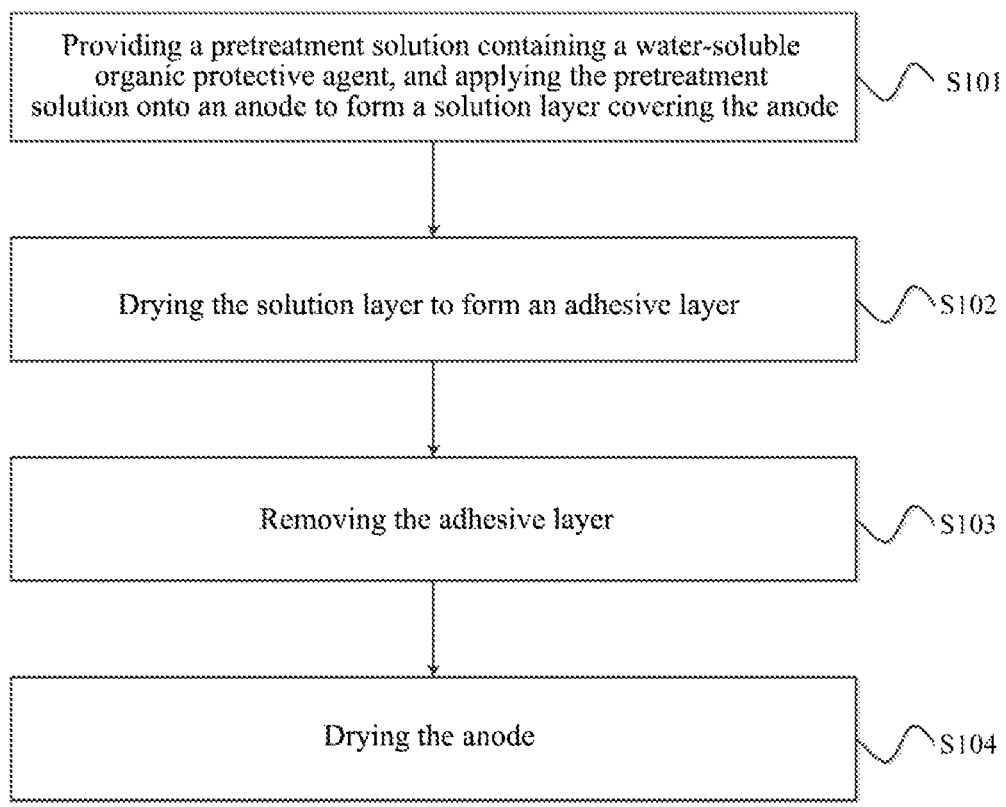

of a display panel and a display device, and belongs to the field of display technologies.

DISPLAY PANEL, MANUFACTURING METHOD THEREOF, AND DISPLAY DEVICE

CROSS-REFERENCE TO RELATED APPLICATIONS

This application claims is a continuation of International Application No. PCT/CN2019/089088, filed on May 29, 2019, which claims priority to Chinese Patent Application No. 201811429243.1, filed on Nov. 27, 2018, both of which are hereby incorporated by reference in their entireties.

FIELD

The present application relates to a manufacturing method, particularly, to a display panel, a manufacturing method thereof and a display device, and belongs to the field of display technologies.

BACKGROUND

An Organic Light Emitting Diode (OLED for short) displayer relates to a flat panel display technology with a promising prospect, which has characteristics of self-illumination, simple structure, super light and thin, fast response, wide visual angle, low power consumption and flexible display available. Therefore, at the current stage, the OLED displayer has been favored by a majority of displayer manufacturers, and plays an important role in the field of display technologies.

In the prior art, the Organic Light Emitting Diode has a high driving voltage and a low current efficiency, which thus needs to be further improved in its performance.

SUMMARY

The present application provides a display panel, a manufacturing method thereof, and a display device, where the method can effectively improve a current efficiency of the display panel and reduce a driving voltage of the display panel.

The present application provides a manufacturing method of a display panel, including: providing a pretreatment solution containing a water-soluble organic protective agent, and applying the pretreatment solution onto an anode so as to form a solution layer covering the anode; drying the solution layer so as to form an adhesive layer; removing the adhesive layer; and drying the anode; where the pretreatment solution contains 10-30% by weight of propylene glycol methyl ether and 70-90% by weight of water.

The present application also provides a display panel, including an anode experienced a pretreatment; where the pretreatment includes: covering the anode with a pretreatment solution and drying to form an adhesive layer, removing the adhesive layer and drying the anode; the pretreatment solution contains 10-30% by weight of propylene glycol methyl ether and 70-90% by weight of water.

In an example of the present application, the display panel is manufactured by the manufacturing method of the display panel described above. Conditions, processes, functions and other contents described in the manufacturing method of the display panel described are also applicable to the display panel here, and will not be described here again.

The present application also provides a flexible display device including the display panel described above.

According to the present application, current efficiency of the display panel can be effectively improved by coating the anode with a special solution, e.g., the current efficiency can be increased by 16.7% or more, meanwhile a driving voltage of the display panel can also be reduced to further reduce energy consumption of the display panel.

In the present application, by means of treatment on the anode and by adjusting parameters for coating the anode, such as the solution composition, the drying temperature and the drying time, the current efficiency of the display panel may be greatly improved, without changing other performances of the display panel or affecting other subsequent processes and conditions. Moreover, according to the present application, it is possible to avoid the influence of the debris generated by an array substrate during a cutting process on a display effect of the screen, effectively protect cleanness of the anode surface, further improve the working efficiency of the display panel, and prolong the service life of the display panel.

BRIEF DESCRIPTION OF DRAWINGS

FIG. 1 is a flowchart illustrating a manufacturing method of a display panel according to the present application.

DETAILED DESCRIPTION

FIG. 1 is a flowchart illustrating a manufacturing method of a display panel according to the present application. FIG. 1 only exemplarily illustrates the method in the present application with an OLED display panel. The method includes:

S101: providing a pretreatment solution containing a water-soluble organic protective agent, and applying the pretreatment solution onto an anode to form a solution layer covering the anode.

The pretreatment solution contains 10-30% by weight of propylene glycol methyl ether and 70-90% by weight of water.

The anode in the present application may be made from a conventional anode material, such as indium tin oxide (ITO), indium zinc oxide (IZO), stannic oxide ($SnO_2$), zinc oxide (ZnO) and other transparent conductive oxide materials or any combination thereof.

The anode is formed on an array substrate. The array substrate may include a base of glass or polymer material, and an array layer group formed on the base. The array layer group is formed with a thin film transistor (TFT), which is electrically connected to the anode. A hole injection layer, a hole transport layer, an electron blocking layer, a light emitting layer, a hole blocking layer, an electron transport layer, an electron injection layer and a cathode are successively deposited on the anode. These are known to those skilled in the art and will not be repeated.

In this example, before other functional layers (e.g., the hole injection layer) are deposited on the anode, it is necessary to pretreat the anode with the pretreatment solution.

The pretreatment solution in this example contains 10-30% by weight of propylene glycol methyl ether and 70-90% by weight of water, where the propylene glycol methyl ether is also known as methyl-propylene glycol-methyl ether-propanol (CAS: 107-98-2).

Furthermore, by adjusting the proportion of each composition within the above range, the pretreatment solution may have a viscosity of 100-200 cp at 25° C., so that it is beneficial to subsequent efficient extension of the pretreatment solution on the anode.

During preparation of the above pretreatment solution, it is necessary to add the propylene glycol methyl ether into water at 20-25° C. and stir them for 5-20 min to obtain the pretreatment solution.

In S101, the method for forming the solution layer covering the anode includes: coating the pretreatment solution onto the anode, by one of spin coating, ink-jet printing and blade coating, to form the solution layer. Preferably, the spin coating may be selected.

In the event that the spin coating is selected to allow the pretreatment solution to form the solution layer covering the anode, a low homogenization speed is 10-100 rpm/10 s, and a high homogenization speed is 100-1500 rpm/10 s.

Specifically, after adding the pretreatment solution onto a surface of the anode, the pretreatment solution on the anode is gradually and uniformly covered on the anode by rotation of a rotary table, to form the solution layer. Generally, the speed of the rotary table may be 10-150 rpm/10 s at an initial stage of rotation, and it may be gradually increased to 800-1500 rpm/10 s as the pretreatment solution is gradually covered on the anode. Preferably, the low homogenization speed is 50 rpm/10 s, and the high homogenization speed is 1000 rpm/10 s.

The above coating speed can effectively guarantee the coating uniformity of the pretreatment solution on the anode.

After the coating of the pretreatment solution onto the anode is completed, the solution layer covering the anode is formed on the anode.

S102: drying the solution layer to form an adhesive layer.

In S102, the solution layer is formed into an adhesive layer by drying the solution layer.

During implementation, the drying of the solution layer can be performed by means of hot air drying or hot plate drying.

The apparent of the adhesive layer is in a molten state.

S103: removing the adhesive layer.

In order to avoid the possibility of the internal insulation of the display panel caused by the adhesive layer, it is also necessary to remove the adhesive layer after the solution layer is dried into the adhesive layer.

For example, a solvent may be used to remove the adhesive layer in the event that the thickness of the adhesive layer is 0.5-10 µm. In another example, pure water may be used to wash the adhesive layer so as to separate the adhesive layer from the anode. Specifically, a pure water flow at a pressure of 2-7 Pa is used to flush the adhesive layer for 2-30 min, preferably for 10 min, so as to remove the adhesive layer.

S104: drying the anode.

In order to avoid that the solvent, which is used in S103 for removing the adhesive layer, remains on the anode and negatively affects the performance of the display panel, it is also necessary to dry the anode after removing the adhesive layer.

Subsequent to the drying, thermal vacuum evaporation, rotary coating, printing or other methods may be used to successively deposit a hole injection layer, a hole transport layer, an electron blocking layer, a light emitting layer, a hole blocking layer, an electron transport layer, an electron injection layer, a cathode, a package layer and a cover plate directly on the anode to complete preparation of the display panel.

The hole injection layer, the hole transport layer, the electron blocking layer, the light emitting layer, the hole blocking layer, the electron transport layer and the electron injection layer may employ organic small molecules, organic macromolecules and polymers common in the art and a combination thereof. The cathode may employ a metal or an alloy such as magnesium, silver, aluminum, aluminum-lithium, magnesium-indium, magnesium-silver, and any combination thereof.

By means of the above treatment on the display panel, not only a driving voltage of the display panel can be reduced, but also current efficiency of the display panel can be effectively improved so that the current efficiency of the display panel is increased by 16.7% or more and power consumption is reduced.

In addition, before other functional layers (such as the hole injection layer) are deposited, it is necessary to cut and adjust the TFT substrate under the anode so that it meets subsequent requirements for equipment size. During the cutting, some cut debris will be sputtered on the anode, which may not only scratch the anode, but also affect a subsequent deposition of functional layers. Therefore, after the surface of the anode in the present application is covered by the adhesive layer, the cut debris will be sputtered on the adhesive layer, thereby avoiding a direct contact between the debris and the anode surface, so that damages caused by the debris on the anode surface will be eliminated, and the debris on the adhesive layer will be removed while the adhesive layer is removed.

Therefore, according to the manufacturing method of the display panel in the present application, not only current efficiency of the display panel can be effectively improved and a driving voltage can be reduced, but also possible damages to the anode can be avoided and the service life of the display panel is further prolonged.

Furthermore, in S101, a volume of 2.3-3.5 L of the pretreatment solution is needed to cover per square meter of the anode. Such proportion enables the adhesive layer, which is obtained after the solution layer is dried, to have a thickness of 0.5-10 µm. Such a thickness can not only avoid a problem that it is difficult for the holes to be effectively transferred to the light emitting layer due to difficulty in removal of the adhesive layer, but also enable the anode to be fully treated to effectively increase current efficiency of the panel.

Furthermore, in S102, the drying of the solution layer may be performed by means of hot air drying or hot plate drying. For example, if the hot air drying method is employed, the drying temperature is 35-65° C., and the drying time is 2-6 min. If the hot plate drying method is employed, the drying temperature is 40-55° C., and the drying time is 2-5 min.

In S102, the drying temperature and the drying time should be strictly controlled. Otherwise, in the event that the water is evaporated too much, the adhesive layer will not only be removed difficultly, but also lose its treatment effect on the anode.

Furthermore, in S104, the drying of the anode may be performed by means of hot air drying or hot plate drying. Specifically, during the hot air drying and the hot plate drying, the drying temperature is 120-230° C., and the drying time is 30-120 min. Preferably, the hot air drying may be used to perform the drying for 30 min at 230° C.

The present application also provides a display panel including an anode experienced a pretreatment;
  where the pretreatment includes: drying a pretreatment solution covered on the anode to form an adhesive layer, then removing the adhesive layer and drying the anode; and
  the pretreatment solution contains 10-30% by weight of propylene glycol methyl ether and 70-90% by weight of water.

The method and function for pretreating the anode with the pretreatment solution may be the same as those in the above description, and will not described here again.

The present application also provides a flexible display device, which may be an OLED display device and any product or component having a display function, such as a TV, a digital camera, a mobile phone, a tablet computer, a smart watch, an e-book, a navigator and others that include the OLED display device.

The flexible display device includes the display panel as described above, where the display panel has the same structure, function and implementation as described above, and details will not be described here again.

In the following, the present application will be further described in detail in combination with specific examples.

EXAMPLE 1

The manufacturing method of the display panel in this example includes the following steps:

An array layer group and an anode are successively manufactured on a base, where the anode is made of an ITO material.

A pretreatment solution is uniformly coated onto the anode by means of spin coating, to form a solution layer on the anode; where a volume of 2.57 L of the pretreatment solution is needed to cover per square meter of the anode; during the spin coating, a low homogenization speed is 50 rpm/10 s, and a high homogenization speed is 1500 rpm/10 s.

The solution layer is dried by means of hot plate drying to obtain an adhesive layer, where the drying temperature is 40° C., and the drying time is 5 min; and the thickness of the adhesive layer is 2.5 µm.

After the adhesive layer is formed, a water flow with a water pressure of 5 Pa is used to flush the adhesive layer to remove the adhesive layer; where the flushing time is 10 min.

After the adhesive layer is removed, the anode is dried by means of hot plate drying; where the drying temperature is 230° C., and the drying time is 30 min.

A thermal vacuum evaporation method is used to successively deposit a hole injection layer, a hole transport layer, an electron blocking layer, a light emitting layer, a hole blocking layer, an electron transport layer, an electron injection layer, a cathode, a package layer and a cover plate directly on the anode to obtain the display panel 1 # in this example.

In this example, the pretreatment solution consists of 10% by weight of propylene glycol methyl ether and 90% by weight of water.

A preparation method of the pretreatment solution lies in: at 25° C., adding water into the propylene glycol methyl ether, and stirring them for 5 min until a homogeneous mixture is obtained.

As measured by an Ubbelohde viscometer, the pretreatment solution has a viscosity of 140 cp (at 25° C.).

EXAMPLE 2

The manufacturing method of the display panel according to this example includes the following steps:

An array layer group and an anode are successively manufactured on a base, where the anode is made of an ITO material.

A pretreatment solution is uniformly coated onto the anode by means of spin coating, to form a solution layer on the anode; where a volume of 2.72 L of the pretreatment solution is needed to cover per square meter of the anode; during the spin coating, a low homogenization speed is 100 rpm/10 s, and a high homogenization speed is 1400 rpm/10 s.

The solution layer is dried by means of hot plate drying to obtain an adhesive layer, where the drying temperature is 40° C., and the drying time is 5 min; and the thickness of the adhesive layer is 3 µm.

After the adhesive layer is formed, a water flow with a water pressure of 5 Pa is used to flush the adhesive layer to remove the adhesive layer; where the flushing time is 12 min.

After the adhesive layer is removed, the anode is dried by means of hot plate drying; where the drying temperature is 230° C., and the drying time is 30 min.

A thermal vacuum evaporation method is used to successively deposit a hole injection layer, a hole transport layer, an electron blocking layer, a light emitting layer, a hole blocking layer, an electron transport layer, an electron injection layer, a cathode, a package layer and a cover plate directly on the anode to obtain the display panel 2 # in this example.

In this example, the pretreatment solution consists of 15% by weight of propylene glycol methyl ether and 85% by weight of water.

A preparation method of the pretreatment solution lies in: at 25° C., adding water into the propylene glycol methyl ether, and stirring them for 5 min until a homogeneous mixture is obtained.

As measured by an Ubbelohde viscometer, the pretreatment solution has a viscosity of 150 cp (at 25° C.).

EXAMPLE 3

The manufacturing method of the display panel according to this example includes the following steps:

An array layer group and an anode are successively manufactured on a base, where the anode is made of an ITO material.

A pretreatment solution is uniformly coated onto the anode by means of spin coating, to form a solution layer on the anode; where a volume of 2.86 L of the pretreatment solution is needed to cover per square meter of the anode; during the spin coating, a low homogenization speed is 150 rpm/10 s, and a high homogenization speed is 1300 rpm/10 s.

The solution layer is dried by means of hot plate drying to obtain an adhesive layer, where the drying temperature is 40° C., and the drying time is 5 min; and the thickness of the adhesive layer is 3.5 µm.

After the adhesive layer is formed, a water flow with a water pressure of 5 Pa is used to flush the adhesive layer to remove the adhesive layer; where the flushing time is 15 min.

After the adhesive layer is removed, the anode is dried by means of hot plate drying; where the drying temperature is 230° C., and the drying time is 30 min.

A thermal vacuum evaporation method is used to successively deposit a hole injection layer, a hole transport layer, an electron blocking layer, a light emitting layer, a hole blocking layer, an electron transport layer, an electron injection layer, a cathode, a package layer and a cover plate directly on the anode to obtain the display panel 3 # in this example.

In this example, the pretreatment solution consists of 20% by weight of propylene glycol methyl ether and 80% by weight of water.

A preparation method of the pretreatment solution lies in: at 25° C., adding water into the propylene glycol methyl ether, and stirring them for 5 min until a homogeneous mixture is obtained.

As measured by an Ubbelohde viscometer, the pretreatment solution has a viscosity of 180 cp (at 25° C.).

EXAMPLE 4

The manufacturing method of the display panel according to this example includes the following steps:

An array layer group and an anode are successively manufactured on a base, where the anode is made of an ITO material.

A pretreatment solution is uniformly coated onto the anode by means of spin coating, to form a solution layer on the anode; where a volume of 2.9 L of the pretreatment solution is needed to cover per square meter of the anode; during the spin coating, a low homogenization speed is 150 rpm/10 s, and a high homogenization speed is 1300 rpm/10 s.

The solution layer is dried by means of hot plate drying to obtain an adhesive layer, where the drying temperature is 40° C., and the drying time is 5 min; and the thickness of the adhesive layer is 3.5 μm.

4. After the adhesive layer is formed, a water flow with a water pressure of 7 Pa is used to flush the adhesive layer to remove the adhesive layer; where the flushing time is 10 min.

After the adhesive layer is removed, the anode is dried by means of hot plate drying; where the drying temperature is 230° C., and the drying time is 30 min.

A thermal vacuum evaporation method is used to successively deposit a hole injection layer, a hole transport layer, an electron blocking layer, a light emitting layer, a hole blocking layer, an electron transport layer, an electron injection layer, a cathode, a package layer and a cover plate directly on the anode to obtain the display panel 4 # in this example.

In this example, the pretreatment solution consists of 28% by weight of propylene glycol methyl ether and 72% by weight of water.

A preparation method of the pretreatment solution lies in: at 25° C., adding water into the propylene glycol methyl ether, and stirring them for 5 min until a homogeneous mixture is obtained.

As measured by an Ubbelohde viscometer, the pretreatment solution has a viscosity of 195 cp (at 25° C.).

EXAMPLE 5

The manufacturing method of the display panel according to this example includes the following steps:

An array layer group and an anode are successively manufactured on a base, where the anode is made of an ITO material.

A pretreatment solution is uniformly coated onto the anode by means of spin coating, to form a solution layer on the anode; a volume of 3 L of the pretreatment solution is needed to cover per square meter of the anode; during the spin coating, a low homogenization speed is 150 rpm/10 s, and a high homogenization speed is 1100 rpm/10 s.

The solution layer is dried by means of hot air drying to obtain an adhesive layer, where the drying temperature is 60° C., and the drying time is 5 min; and the thickness of the adhesive layer is 3.9 μm.

After the adhesive layer is formed, a water flow with a water pressure of 2 Pa is used to flush the adhesive layer to remove the adhesive layer; where the flushing time is 20 min.

After the adhesive layer is removed, the anode is dried by means of hot plate drying; where the drying temperature is 230° C., and the drying time is 30 min.

A thermal vacuum evaporation method is used to successively deposit a hole injection layer, a hole transport layer, an electron blocking layer, a light emitting layer, a hole blocking layer, an electron transport layer, an electron injection layer, a cathode, a package layer and a cover plate directly on the anode to obtain the display panel 5 # in this example.

In this example, the pretreatment solution consists of 22% by weight of propylene glycol methyl ether and 78% by weight of water.

A preparation method of the pretreatment solution lies in: at 25° C., adding water into the propylene glycol methyl ether, and stirring them for 5 min until a homogeneous mixture is obtained.

As measured by an Ubbelohde viscometer, the pretreatment solution has a viscosity of 185 cp (at 25° C.).

EXAMPLE 6

The manufacturing method of the display panel according to this example includes the following steps:

An array layer group and an anode are successively manufactured on a base, where the anode is made of an ITO material.

A pretreatment solution is uniformly coated onto the anode by means of spin coating, to form a solution layer on the anode; where a volume of 3.5 L of the pretreatment solution is needed to cover per square meter of the anode; during the spin coating, a low homogenization speed is 100 rpm/10 s, and a high homogenization speed is 1000 rpm/10 s.

The solution layer is dried by means of hot air drying to obtain an adhesive layer, where the drying temperature is 50° C., and the drying time is 6 min; and the thickness of the adhesive layer is 5.5 μm.

After the adhesive layer is formed, a water flow with a water pressure of 5 Pa is used to flush the adhesive layer to remove the adhesive layer; where the flushing time is 20 min.

After the adhesive layer is removed, the anode is dried by means of hot plate drying; where the drying temperature is 230° C., and the drying time is 30 min.

A thermal vacuum evaporation method is used to successively deposit a hole injection layer, a hole transport layer, an electron blocking layer, a light emitting layer, a hole blocking layer, an electron transport layer, an electron injection layer, a cathode, a package layer and a cover plate directly on the anode to obtain the display panel 6 # in this example.

In this example, the pretreatment solution consists of 30% by weight of propylene glycol methyl ether and 70% by weight of water.

A preparation method of the pretreatment solution lies in: at 25° C., adding water into the propylene glycol methyl ether, and stirring them for 5 min until a homogeneous mixture is obtained.

As measured by an Ubbelohde viscometer, the pretreatment solution has a viscosity of 230 cp (at 25° C.).

Comparative Example 1

The manufacturing method of the display panel in the comparative example is basically the same as that in Example 1, the only difference therebetween lies in that the anode in the comparative example is not subject to any pretreatment to obtain the display panel 7 #.

Test Example

In the event that the required luminance for the display panels in Examples 1 #-6 # and the display panel according to the comparative example 7 # is 10000 cd/m², the following parameters are tested by a PR705 spectral scanning colorimeter, and the results are shown in Table 1:
1. Driving voltage
2. Current efficiency
3. CIE-x (CIE is short for "International Commission on illumination")
4. CIE-y
5. Electroluminescent (EL) peak

TABLE 1

| | Required luminance cd/m² | Driving voltage V | Current efficiency cd/A | CIE-x | CIE-y | EL peak nm |
|---|---|---|---|---|---|---|
| 1# | 10000 | 3.79 | 127.88 | 0.2456 | 0.7161 | 528 |
| 2# | 10000 | 3.82 | 127.06 | 0.2488 | 0.7065 | 528 |
| 3# | 10000 | 3.80 | 130.76 | 0.2489 | 0.7098 | 528 |
| 4# | 10000 | 3.76 | 131.42 | 0.2478 | 0.7098 | 528 |
| 5# | 10000 | 3.85 | 129.60 | 0.2467 | 0.7145 | 528 |
| 6# | 10000 | 3.70 | 125.90 | 0.2473 | 0.7154 | 528 |
| 7# | 10000 | 3.88 | 107.88 | 0.2416 | 0.7101 | 528 |

It can be known from Table 1 that the display panels 1 #-6 # obtained by the manufacturing method according to the present application are significantly improved in performance, compared to the comparative example. For example, in the display panels 1 #-6 # obtained by the manufacturing method according to the present application, the current efficiency is increased by 16.7-21.8%, and the driving voltage is significantly lower than that of the display panel 7 # in the comparative example 1. Therefore, according to the manufacturing method in the present application, current efficiency of the display panel can be effectively improved, a driving voltage is reduced, and energy consumption is reduced.

What is claimed is:

1. A manufacturing method of a display panel, comprising the following steps:
   providing an anode and a pretreatment solution containing a water-soluble organic protective agent, and applying the pretreatment solution onto the anode to form a solution layer covering the anode;
   drying the solution layer to form an adhesive layer;
   removing the adhesive layer; and
   drying the anode;
   wherein the pretreatment solution contains 10-30% by weight of propylene glycol methyl ether and 70-90% by weight of water.

2. The manufacturing method of the display panel according to claim 1, wherein the pretreatment solution has a viscosity of 100-200 cp at 25° C.

3. The manufacturing method of the display panel according to claim 2, wherein the adhesive layer has a thickness of 0.5-10 μm.

4. The manufacturing method of the display panel according to claim 3, wherein in the step of drying the solution layer to form an adhesive layer, the drying is performed at a temperature of 35-65° C. for 2-6 min.

5. The manufacturing method of the display panel according to claim 4, wherein in the step of drying the solution layer to form an adhesive layer, the drying is performed at a temperature of 40-55° C. for 2-5 min.

6. The manufacturing method of the display panel according to claim 4, wherein in the step of removing the adhesive layer, a water flow at a pressure of 2-7 Pa is used to flush the adhesive layer to remove the adhesive layer; or a solvent is used to remove the adhesive layer.

7. The manufacturing method of the display panel according to claim 6, wherein in the step of providing an anode and a pretreatment solution containing a water-soluble organic protective agent and applying the pretreatment solution onto the anode to form a solution layer covering the anode, a volume of 2.3-3.5 L of the pretreatment solution is needed to cover per square meter of the anode.

8. The manufacturing method of the display panel according to claim 6, wherein in the step of drying the anode, the drying is performed at a temperature of 120-230° C. for 30-120 min.

9. The manufacturing method of the display panel according to claim 1, wherein the forming of the solution layer covering the anode comprises: coating the pretreatment solution onto the anode, by any one of spin coating, ink-jet printing and blade coating, to form the solution layer.

10. The manufacturing method of the display panel according to claim 9, wherein the pretreatment solution is coated onto the anode, by the spin coating, to form the solution layer, and at least one of a low homogenization speed of 10-150 rpm/10 s and a high homogenization speed of 150-1500 rpm/10 s is used for coating.

11. A display panel, comprising an anode that experienced a pretreatment;
    wherein the pretreatment comprises: covering a pretreatment solution onto the anode and drying to form an adhesive layer, removing the adhesive layer and drying the anode; and
    the pretreatment solution contains 10-30% by weight of propylene glycol methyl ether and 70-90% by weight of water.

12. The display panel according to claim 11, wherein the pretreatment solution has a viscosity of 100-200 cp at 25° C.

13. The display panel according to claim 11, wherein the adhesive layer has a thickness of 0.5-10 μm.

14. The display panel according to claim 11, wherein the drying to form the adhesive layer is performed at a temperature of 35-65° C. for 2-6 min.

15. The display panel according to claim 14, wherein the drying to form the adhesive layer is performed at a temperature of 40-55° C. for 2-5 min.

16. The display panel according to claim 11, wherein the removing the adhesive layer is performed by flushing the adhesive layer using a water flow at a pressure of 2-7 Pa, or is performed by a solvent.

17. The display panel according to claim 11, wherein a volume of 2.3-3.5 L of the pretreatment solution is needed to cover per square meter of the anode.

18. The display panel according to claim 11, wherein the drying the anode is performed at a temperature of 120-230° C. for 30-120 min.

19. The display panel according to claim 11, wherein the pretreatment solution is coated onto the anode, by spin coating, to form a solution layer, wherein at least one of a low homogenization speed of 10-150 rpm/10 s and a high homogenization speed of 150-1500 rpm/10 s is used for coating.

20. A flexible display device, comprising the display panel according to claim 11.

* * * * *